(12) United States Patent
Chui et al.

(10) Patent No.: US 8,013,632 B1
(45) Date of Patent: Sep. 6, 2011

(54) INTEGRATED CIRCUIT WITH GLOBAL HOTSOCKET ARCHITECTURE

(75) Inventors: Jack Chui, Fremont, CA (US); Linda Chu, San Jose, CA (US); Toan D. Do, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/638,799

(22) Filed: Dec. 15, 2009

(51) Int. Cl.
*H03K 19/0175* (2006.01)

(52) U.S. Cl. .............................. 326/82; 326/81; 326/38

(58) Field of Classification Search .................... 326/33, 326/56–58, 80–83; 327/530, 535, 538
See application file for complete search history.

(56) References Cited

U.S. PATENT DOCUMENTS

| | | | |
|---|---|---|---|
| 5,825,206 A | 10/1998 | Krishnamurthy et al. | |
| 5,990,705 A * | 11/1999 | Lim ................ | 326/81 |
| 6,040,712 A | 3/2000 | Mejia | |
| 6,154,845 A | 11/2000 | Ilkbahar et al. | |
| 6,549,032 B1 * | 4/2003 | Shumarayev et al. ......... | 326/33 |
| 6,630,844 B1 | 10/2003 | Chong et al. | |
| 6,670,676 B1 | 12/2003 | Rahim | |
| 6,810,458 B1 | 10/2004 | Bazargan et al. | |
| 6,857,037 B2 | 2/2005 | Messmer et al. | |
| 6,870,400 B1 | 3/2005 | Chong et al. | |
| 6,972,593 B1 | 12/2005 | Wang et al. | |
| 7,085,870 B2 * | 8/2006 | Do ................................ | 710/302 |
| 7,119,579 B2 | 10/2006 | Chong et al. | |
| 7,304,501 B2 | 12/2007 | Wang et al. | |
| 7,363,414 B2 | 4/2008 | Do | |
| 7,893,716 B1 * | 2/2011 | Chui et al. ...................... | 326/82 |

OTHER PUBLICATIONS

Chui et al., U.S. Appl. No. 11/801,864, filed May 11, 2007.
"Cyclone II Device Handbook, vol. 1," Handbook of Altera Corporation of San Jose, CA, pp. 4-1 to 4-6 (Feb. 2007).

* cited by examiner

*Primary Examiner* — Vibol Tan
(74) *Attorney, Agent, or Firm* — Treyz Law Group; David C. Kellogg; G. Victor Treyz

(57) ABSTRACT

Integrated circuits such as programmable logic devices are provided with hotsocket detection circuitry. The hotsocket detection circuitry monitors signals on data pins and power supply voltages. If the data pins become active before the power supply voltages have reached appropriate levels, a hotsocket condition is identified. When a hotsocket condition is identified, driver circuitry on the integrated circuit can be disabled by a hotsocket signal. The integrated circuit may include multiple blocks of input-output circuitry, each of which includes a local hotsocket circuit that uses global hotsocket and power-on-reset signals in disabling input-output circuitry in that input-output block. A power supply circuit in each input-output block may ensure that the local hotsocket circuit in that input-output block is powered.

18 Claims, 9 Drawing Sheets

| Vccq | Vccpd | Vccn | N GLOBAL HOTSOCKET | NPOR | Vpin-n | NODE A |
|---|---|---|---|---|---|---|
| READY | READY | READY | 1 (V$_{HOTSOCKET}$) | 1 | Vpin-n < Vccn | 0 |
| READY | READY | READY | 1 (V$_{HOTSOCKET}$) | 1 | Vpin-n > Vccn | 0 |
| NOT READY | READY | READY | 0 | 0 | Vpin-n < Vccn | 1 (Vccn) |
| NOT READY | READY | READY | 0 | 0 | Vpin-n > Vccn | 1 (Vpin-n) |
| READY | NOT READY | READY | 0 | 0 | Vpin-n < Vccn | 1 (Vccn) |
| READY | NOT READY | READY | 0 | 0 | Vpin-n > Vccn | 1 (Vpin-n) |
| READY | READY | NOT READY | 0 | 0 | Vpin-n > Vccn | 1 (Vpin-n) |
| NOT READY | NOT READY | NOT READY | 0 | 0 | Vpin-n > Vccn | 1 (Vpin-n) |

INTEGRATED CIRCUIT WITH GLOBAL HOTSOCKET ARCHITECTURE

BACKGROUND

This invention relates to integrated circuits such as programmable logic device integrated circuits, and more particularly, to hotsocket circuitry for programmable logic devices and other integrated circuits.

Integrated circuits such as programmable logic devices have power pins and data pins. The power pins on an integrated circuit chip are used to supply power supply voltages to internal circuitry on the chip. The data pins are coupled to input-output (I/O) circuits that are typically located around the periphery of the chip. Data pins are used to convey data signals to and from the I/O circuits.

The pins on an integrated circuit are often used to form communications ports. Commonly-used ports include ports that support standards such as the universal serial bus (USB) standard, the Firewire standard (IEEE 1394), etc. Electronic components that use these ports are often designed to be hot swappable. A hot-swappable component can be inserted into a system or removed from a system without powering down the system.

When a hot-swappable peripheral is connected to a powered port, it is not known in advance which pins in the port will be the first to make electrical contact with each other. If a user inserts a peripheral in one way, the power pins in the port may be the first to be electrically connected with each other. If, however, the user inserts the peripheral in a slightly different way, the data pins may be the first to make electrical contact with each other. This type of uncertainty about the order in which the data and power pins are connected must be taken into account when designing integrated circuits for hot swappable applications. For example, such circuits should be designed to avoid circuit failures in situations in which the data pins of the integrated circuit receive signals before the power supply pins have received power and before the circuits of the integrated circuit have had an opportunity to be properly powered up and establish normal operating conditions.

To provide tolerance to hot swapping, integrated circuits such as programmable logic devices have employed so-called hotsocket detectors to detect when the data pins receive signals before the power pins. This type of out-of-order scenario is often referred to as a hotsocket condition.

It would be desirable to be able to provide improved hotsocket detector circuitry on integrated circuits such as programmable logic devices.

SUMMARY

In accordance with the present invention, programmable logic devices and other integrated circuits are provided that have improved hotsocket detection circuitry. An integrated circuit may have core logic that operates at a core power supply voltage. Input-output logic may be powered at an input-output power supply voltage that is greater than the core power supply voltage. If desired, predrivers may be provided between the core logic and input-output logic to assist in boosting signal strengths. Predrivers may be powered using a predriver power supply voltage that is greater than the core power supply voltage and that is greater than, less than, or approximately equal to the input-output power supply voltage.

The input-output logic may have a number of blocks of input-output circuitry. Each input-output block may have an input driver and an output driver. The input and output drivers may be used to convey signals between an associated data pin and the predriver or core logic.

Hotsocket detection circuitry may evaluate power supply voltages such as the core power supply voltage, the predriver power supply voltage, and the input-output power supply voltage and may evaluate data signals from the data pins to determine whether an out-of-order condition (a "hotsocket condition") exists that could damage the integrated circuit or place the integrated circuit in an undesired state. When a hotsocket condition is detected, the input and output drivers can be temporarily disabled.

Global hotsocket detectors may be used to generate a global hotsocket signal after comparing signals such as a core logical power supply voltage, a predriver power supply voltage, and an input-output power supply voltage, etc. Power-on-reset circuitry may also be used in conjunction with the global hotsocket detectors. One or more global hotsocket and power-on-reset signals may be routed to each of the input-output blocks and to local hotsocket circuits, each of which is associated with an input-output block.

Each input-output block may include a local power supply circuit that powers the local hotsocket circuit in that input-output block. Each power supply circuit may use signals from a data pin associated with that input-output block and may use one of the power supply voltages such as the input-output power supply voltage in generating a local power supply voltage. The local power supply circuit may power local hotsocket protection circuitry such as a NOR gate, an inverter, and a transistor that together protect input-output circuitry in that input-output block from damage during hotsocket conditions.

Further features of the invention, its nature and various advantages will be more apparent from the accompanying drawings and the following detailed description of the preferred embodiments.

BRIEF DESCRIPTION OF THE DRAWINGS

FIG. 7 is a table setting forth how hotsocket detector circuitry of the type shown in FIG. 6A may operate on an integrated circuit such as a programmable logic device integrated circuit in accordance with an embodiment of the present invention.

DETAILED DESCRIPTION

The present invention relates to ways in which to provide hotsocket detection capabilities to integrated circuits. The invention applies to any suitable integrated circuits such as digital signal processors, microprocessors, application-specific integrated circuits, programmable circuits, etc. For clarity, the present invention will sometimes be described in the context of programmable digital integrated circuits such as programmable logic device integrated circuits. This is, however, merely illustrative.

Figure 1:
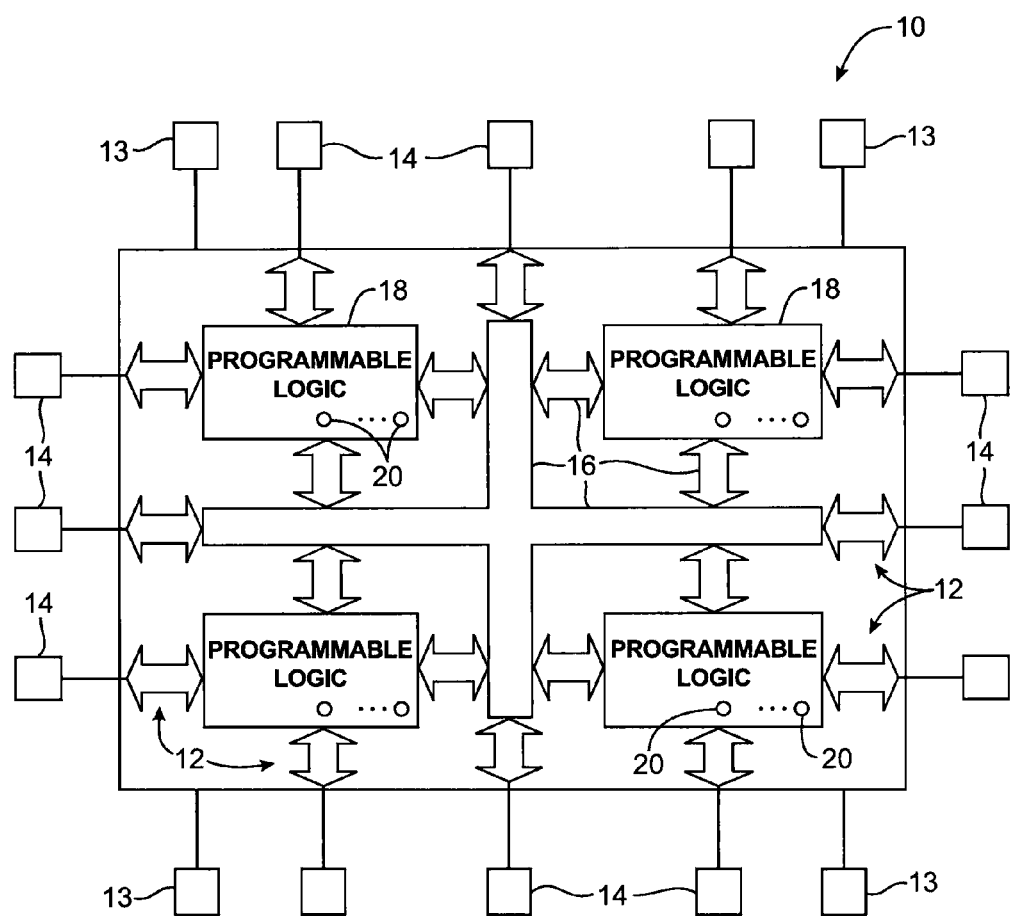
FIG. 1 is a schematic diagram of an illustrative integrated circuit that may include global and local hotsocket circuits in accordance with an embodiment of the present invention.

An illustrative programmable logic device 10 in accordance with the present invention is shown in FIG. 1.

Programmable logic device 10 may have input/output circuitry 12 for driving signals off of device 10 and for receiving signals from other devices via input/output data pins 14. Power supply pins such as pins 13 may be used to provide power supply signals to device 10. Interconnection resources 16 such as vertical and horizontal conductive lines may be used to route signals on device 10.

Programmable logic device 10 may have core circuitry 18 (sometimes referred to as "core logic"). Core logic 18 may include combinational and sequential logic circuitry. The circuitry of device 10 such as core circuitry 18, interconnection resources 16, and I/O circuitry 12 may include hardwired circuitry and programmable logic that may be customized ("programmed") by a user to perform a desired custom logic function.

Programmable logic device 10 may be based on any suitable programmable technology. With one suitable approach, configuration data (also called programming data) may be loaded into programmable elements using pins 14 and input/output circuitry 12. In the example of FIG. 1, a number of illustrative programmable elements 20 are shown. In general, there are numerous elements 20 on a given device. The programmable elements 20 (also sometimes called configuration bits or programmable function control elements) may each provide a static control output signal that controls the state of an associated logic component in programmable logic device 10.

As an example, the programmable elements 20 may be random-access memory (RAM) cells that are loaded from an external configuration device integrated circuit via pins 14 and input/output circuitry 12. The loaded RAM cells 20 provide static control signals that are applied to the terminals (e.g., gates) of circuit elements (e.g., metal-oxide-semiconductor transistors) in the programmable logic of device 10 to control those elements (e.g., to turn certain transistors on or off) and thereby configure the logic of device 10 so that it performs a desired function. The circuit elements may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from fuses or antifuses, programmable logic devices in which elements 20 are formed from electrically-programmable read-only-memory (EPROM) or erasable-electrically-programmable read-only-memory (EEPROM) technology, programmable logic devices with programmable elements made from magnetic storage elements, mask-programmed programmable elements, etc.

The circuitry of device 10 may be organized using any suitable architecture. As an example, the logic of programmable logic device 10 may be organized in a series of rows and columns of one or more larger programmable logic regions or areas (sometimes referred to as logic array blocks or LABs) each of which contains multiple smaller logic regions or areas (sometimes referred to as logic elements or LEs). These logic resources may be interconnected by interconnection resources 16 such as associated vertical and horizontal conductors. The interconnection conductors 16 may include global conductive lines that span substantially all of device 10, fractional lines such as half-lines or quarter lines that span a substantial part of device 10, staggered lines of a particular length (e.g., sufficient to interconnect several logic areas), smaller local lines that interconnect certain logic regions with other logic regions in a given area, or any other suitable interconnection resource arrangement. Multiplexers and other suitable circuits may be used to interconnect vertical and horizontal conductors to form various user-selected signal paths throughout device 10. If desired, the logic of device 10 may be arranged in more levels or layers in which multiple large areas are interconnected to form still larger portions of logic. Still other device arrangements may use logic that is not arranged in rows and columns.

The programmable logic of device 10 may be based on look-up tables (LUTs) or any other suitable configurable logic circuits. Logic elements (LEs) and other circuits on device 10 may contain register logic for selectively registering data signals.

It is generally desirable to power the components in core logic 18 at a relatively low voltage (e.g., 0.85 volts or lower as advances in semiconductor processing technology permit). The power supply voltage used to power the circuitry in the core is often referred to as Vccq (Vccquiet).

The signals that are driven off of the circuit 10 by input-output circuitry 12 and that are received from external sources by input-output circuitry 12 may have higher voltages (e.g., 1.2 to 3.3 volts as examples). This allows these signals to tolerate the noisier environments that are generally found on chip-to-chip signal busses and provides a proper interface with circuits operating at these higher voltages. As a result, it is often desirable to supply the input-output circuitry 12 of circuit 10 with a power supply voltage in this higher voltage range. This potentially elevated input-output circuit power supply voltage is often referred to as Vccn (Vccnoisy). Circuit 10 may receive a ground signal Vss (e.g., a 0 volt power supply signal) using one of pins 13. Other power supply voltages may also be used in device 10 if desired. For example, intermediate power supply voltages such as a predriver power supply voltage Vccpd (Vccpredriver) may be used in device 10 if desired.

Figure 2:
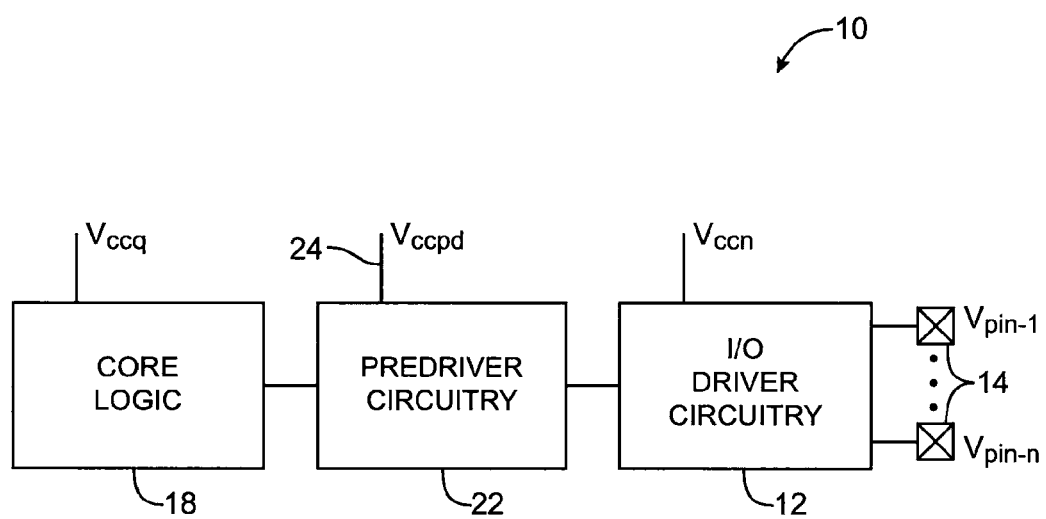
FIG. 2 is a circuit diagram of an illustrative integrated circuit that includes core circuitry, predriver circuitry, and input-output driver circuitry in accordance with an embodiment of the present invention.

In some integrated circuits such as programmable logic devices, it may be desirable to provide predriver circuitry to boost data signal strengths. An illustrative circuit arrangement that uses predriver circuitry is shown in FIG. 2. In device 10 of FIG. 2, core circuitry 18 operates at a reduced voltage supply level of Vccq (e.g., 0.85 volts), which helps to reduce power consumption in circuit 10. The input-output driver circuitry 12 (I/O driver circuitry) operates at a higher voltage supply level of Vccn (e.g., 1.2 to 3.3 volts), which allows the signals produced by I/O driver circuitry 12 to interface with external integrated circuits operating at higher voltages and which makes the signals driven off of circuit 10 more tolerant to noise. Predriver circuitry 22 is powered by an intermediate voltage supply Vccpd (e.g., 2.5 to 3.3 volts supplied at terminal 24) and is used to strengthen signals from core 18 (e.g., signals at 0.85 volts) before these signals are driven off of circuit 10 through pins 14 by I/O driver circuitry 12.

Without the predriver circuitry 22, the transistors in the output driver in I/O circuitry would need to be larger, to ensure that sufficient drive current is produced when these transistors are driven with the 0.85 volt signals from core 18. Using predriver circuitry 22, the 0.85 volt signals from core 18 are converted to signals at an intermediate level (e.g., a voltage between 2.5 and 3.3 volts) before these signals are provided to I/O driver circuitry 12. By applying larger voltage signals to I/O driver circuitry 12, the sizes of the drive transistors in circuitry 12 may be reduced, while still maintaining a suitable output drive capability. Predriver circuitry 22 may also be used in performing other functions such as adjusting slew rates.

It is possible to design an integrated circuit that operates exclusively in well-controlled environments in which the power supply voltages such as Vccq, Vccpd, and Vccn are applied to the circuit before any data signals are applied to pins 14. However, due to the popularity of hot-swappable peripherals, there is an increasing need for integrated circuits that can tolerate hot socket conditions. Such a circuit will operate properly, even if one or more of its data pins happen to receive live signals before the circuit is fully powered up.

Situations in which one or more data pins receive signals before the core logic is active are often referred to as hotsocket conditions and can be detected using hotsocket detection circuitry. In accordance with the present invention, programmable logic device 10 has circuitry for detecting hotsocket conditions and for preventing circuit damage when a hotsocket condition is detected. Portions of an illustrative global hotsocket architecture that may be used by device 10 is shown in FIG. 3.

Figure 3:
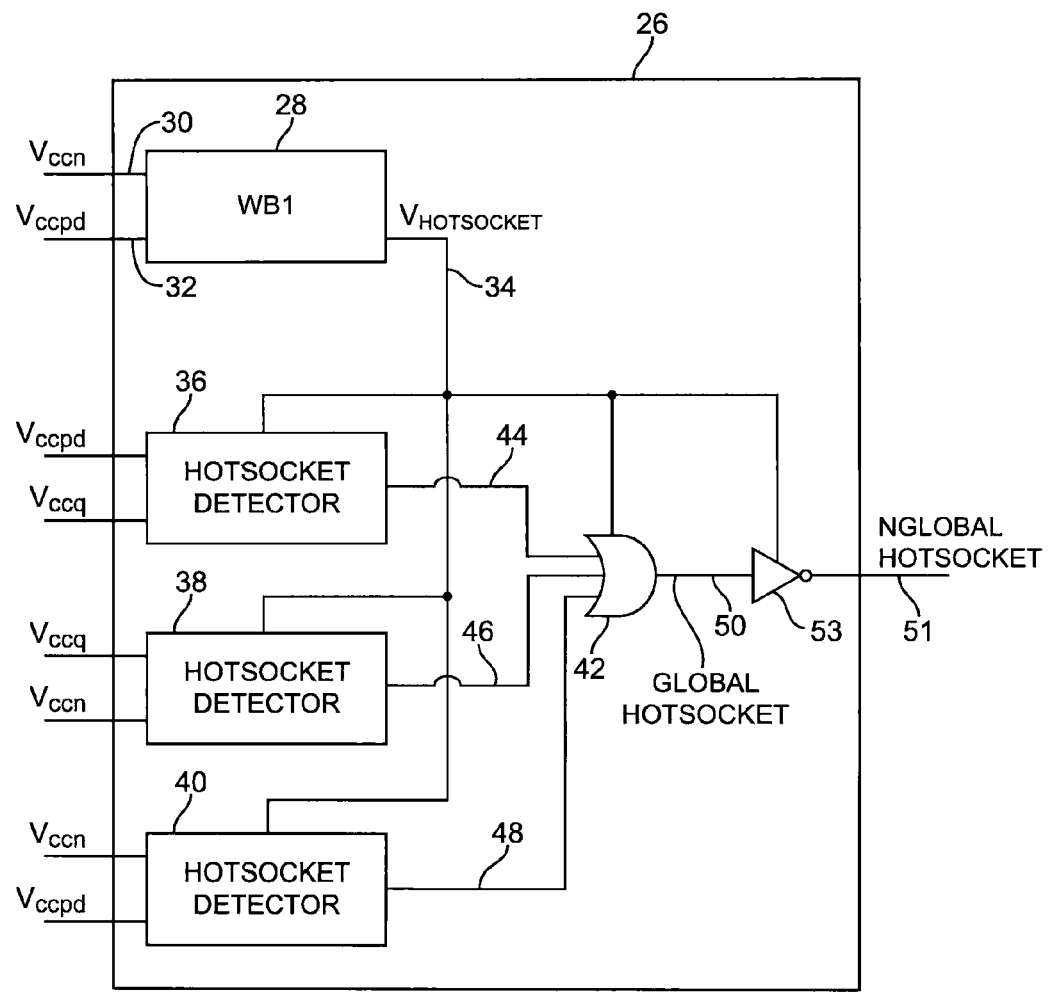
FIG. 3 is a circuit diagram of illustrative global hotsocket circuitry that may be a part of an integrated circuit in accordance with an embodiment of the present invention.

As shown in FIG. 3, device 10 may include global hotsocket circuitry such as circuitry 26. With this hotsocket architecture it is possible to reduce the amount of hotsocketrelated circuitry in device 10. For example, the amount of hotsocket circuitry duplicated in each input-output (I/O) block may be reduced by providing the global hotsocket circuitry 26 of FIG. 3.

Circuitry 26 may include one or more power supply circuits such as power supply circuit 28. Power supply circuit 28 has a first input 30 that receives voltage Vccn (e.g., an inputoutput driver power supply voltage) and a second input 32 that receives voltage Vccpd (e.g., a pre-driver power supply voltage). Voltages Vccn and Vccpd may be generated by power supply circuitry in device 10 or may be received over external integrated circuit input-output pins such as pins 13 of FIG. 1. Power supply circuit 28 produces a signal $V_{HOTSOCKET}$ on output 34 that is equal to the larger of Vccn and Vccpd (e.g., the output 34 is at a voltage equal to the largest voltage on inputs 30 and 32). The output signal $V_{HOTSOCKET}$ on output 34 is received by hotsocket detectors 36, 38, and 40, by OR gate 42, and by inverter 53. In general, the output signal $V_{HOTSOCKET}$ on output 34 provides power supply voltages to the circuits in the global hotsocket circuitry 26, at least during potential hotsocket conditions such as when device 10 is powering up. Power supply circuit 28 may sometimes be referred to herein as an output circuit, a well bias circuit, a first well bias circuit, and a global hotsocket well bias circuit.

Hotsocket detector 36 monitors the power supply voltages Vccpd and Vccq and produces a corresponding hotsocket signal on output 44. During hotsocket conditions, hotsocket detector 36 asserts a hotsocket signal on output 44 on a first input of OR gate 42. With one suitable arrangement, hotsocket detector 36 may assert a logic high signal on output 44 (e.g., a signal at the power supply voltage $V_{HOTSOCKET}$) whenever the power supply voltage Vccpd is less than a first threshold voltage ($V_{T1}$) and/or whenever the power supply voltage Vccq is less than a second threshold voltage ($V_{T2}$). With this type of arrangement, hotsocket detector 36 may assert a logic low signal on output 44 (e.g., a signal at a ground power supply voltage that indicates that detector 36 has not detected hotsocket conditions) when both the power supply voltages Vccpd and Vccq are greater than their respective threshold voltages.

Hotsocket detector 38 monitors the power supply voltages Vccq and Vccn and produces a corresponding hotsocket signal on output 46. Hotsocket detector 38 may assert a logic high signal on output 46 whenever the power supply voltage Vccq is less than the second threshold voltage ($V_{T2}$) and/or whenever the power supply voltage Vccn is less than a third threshold voltage ($V_{T3}$) and may assert a logic low signal on output 46 when the power supply voltages Vccq and Vccn are greater than their respective threshold voltages.

Hotsocket detector 40 monitors the power supply voltages Vccn and Vccpd and produces a corresponding hotsocket signal on output 48. Hotsocket detector 40 may assert a logic high signal on output 48 whenever the power supply voltage Vccn is less than the third threshold voltage ($V_{T3}$) and/or whenever the power supply voltage Vccpd is less than the first threshold voltage ($V_{T1}$) and may assert a logic low signal on output 48 when the power supply voltages Vccn and Vccpd are greater than their respective threshold voltages.

With this arrangement for hotsocket detectors 36, 38, and 40 and OR gate 42, OR gate 42 produces a signal (GLOBAL HOTSOCKET) on output 50 that is at a logic high signal (e.g., $V_{HOTSOCKET}$) whenever any one of the power supply voltages Vccq, Vccpd, and Vccn is below its respective threshold voltage. OR gate 42 produces a signal (GLOBAL HOTSOCKET) on output 50 that is at a logic low level whenever all of the power supply voltages Vccq, Vccpd, and Vccn are above their respective threshold voltages. However, when circuit 28 is not producing a power supply signal (e.g., when Vccn and Vccpd are both not yet available), the output of OR gate 42 may be inappropriate. For example, when Vccn and Vccpd are both not yet available, the output of OR gate 42 may be at a logic low level even though Vccn and Vccpd below their respective threshold voltages (e.g., because there is no logic high signal powering OR gate 42).

The signal on output 50 may therefore be received and inverted by inverter 53. Inverter 53 may produce an inverted global hotsocket signal (N GLOBAL HOTSOCKET) on output 51. Inverter 53 produces a signal (N GLOBAL HOTSOCKET) on output 51 that is at a logic low level whenever at least one of the power supply voltages Vccq, Vccpd, and Vccn is below its respective threshold voltage. Inverter 53 produces a signal (N GLOBAL HOTSOCKET) on output 51 that is at a logic high signal (e.g., $V_{HOTSOCKET}$) when each of the power supply voltages Vccq, Vccpd, and Vccn is above its respective threshold voltage.

With this type of arrangement, the output 51 will be at the appropriate level regardless of the state of the power supply voltages Vccn, Vccpd, and Vccq. For example, when Vccn and Vccpd are both not yet available (e.g., Vccn and Vccpd are approximately equal to a ground voltage), the output 51 of inverter 53 is still low even though the output 50 of OR gate 42 is also low (e.g., because OR gate 42 and inverter 53 are both unpowered in this example). Circuit 26 therefore produces an output at the appropriate level, even when power supply circuit 28 is not producing a valid power supply (e.g., because Vccn and Vccpd are not yet available).

The logic low signal on output 51 may therefore be used to disable circuits in device 10 during hotsocket conditions. The signal on output 51 is only taken high when the power supply voltages Vccpd, Vccq, and Vccn have each risen above their respective threshold voltages ($V_{T1}$, $V_{T2}$, and $V_{T3}$).

Figure 4:
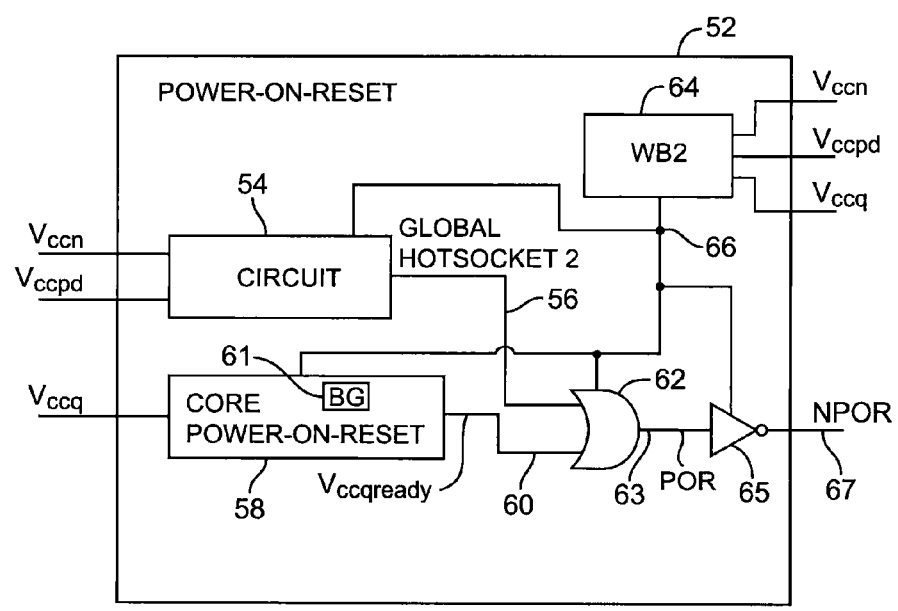
FIG. 4 is a circuit diagram of illustrative power-on-reset and hotsocket circuitry in accordance with an embodiment of the present invention.

As shown in FIG. 4, device 10 may include power-on-reset and hotsocket circuitry such as circuitry 52. Circuitry 52 may include a circuit 54 that monitors the power supply voltages Vccn and Vccpd and that generates a second global hotsocket signal (GLOBAL HOTSOCKET 2) on output 56. The output 56 of circuit 54 is high (e.g., equal to the output 66 of circuit 64) whenever the power supply voltage Vccn and/or the power supply voltage Vccpd are not ready (e.g., have not risen above a threshold level). The output 56 is low when both power supply voltage Vccn and Vccpd have risen above a threshold level.

Circuitry 52 may also include a core power-on-reset circuit 58 that monitors a core power supply voltage Vccq and that generates a core power-on-reset signal on output 60 sometimes referred to as Vccqready. Circuit 58 may also compare Vccq to a reference voltage from band gap reference circuit 61. The output 60 of circuit 58 is high (e.g., equal to the output 66 of circuit 64) whenever the power supply voltage Vccq is not ready (e.g., has not risen above a threshold level). The output 60 is low (e.g., at a ground power supply voltage) when the power supply voltage Vccq has risen above a threshold level. The core power-on-reset signal Vccqready may control whether core circuitry 18 of FIG. 2 is active or inactive during power up operations to ensure that the core circuitry 18 turns on properly.

Circuitry 52 may include power supply circuit 64, as one example. With one suitable arrangement, power supply circuit 64 has three inputs. Each of the three inputs may a respective one of the power supply voltages Vccn, Vccpd, and Vccq. At any particular time, the output 66 of power supply circuitry 64 is a power supply voltage that is approximately equal to the largest of the power supply voltages Vccn, Vccpd, and Vccq at that time. The output 66 of power supply circuitry 64 may be used to power circuit 54, power-on-reset circuit 58, and OR gate 62, if desired. Power supply circuit 64 may sometimes be referred to herein as an output circuit, a well bias circuit, a second well bias circuit, and a power-on-reset well bias circuit.

OR gate 62 has a pair of inputs connected to the outputs 56 and 60 of circuits 54 and 58, respectively. The power-on-reset signal generated by OR gate 62 on output 63 may be a logic one (e.g., a signal at the voltage on output 66 of circuit 64) whenever the output 56 of circuit 54 is high and/or the output 60 of circuit 58 is high. When the outputs 56 and 60 of circuits 54 and 58 are both low, the output 63 of OR gate 62 is also low. However, when power supply circuit 64 is not producing a power supply signal (e.g., when Vccn, Vccpd, and Vccq are all not yet available), the output of OR gate 62 may be inappropriate. For example, when power supply circuit 64 is not producing a power supply signal, the output 63 of OR gate 62 may be at a logic low level even though Vccn, Vccpd, and Vccq are not yet ready (e.g., because there is no logic high signal powering OR gate 62).

The signal on output 63 may therefore be received and inverted by inverter 65. Inverter 65 may produce an inverted power-on-reset signal (NPOR) on output 67. Inverter 65 produces a signal (NPOR) on output 67 that is at a logic low level whenever the output 56 of circuit 54 is high, the output 60 of circuit 58 is high, and/or power supply circuit 64 is not producing a power supply signal (e.g., Vccn, Vccpd, and Vccq are all not yet ready). Inverter 65 produces a signal (NPOR) on output 67 that is at a logic high signal when the outputs 56 and 60 of circuits 54 and 58 are both low and power supply circuit 64 is producing a valid power supply signal on output 66.

With this type of arrangement, the output 67 will be at the appropriate level regardless of the state of the power supply voltages Vccn, Vccpd, and Vccq. For example, when Vccn, Vccpd, and Vccq are all not yet available (e.g., Vccn, Vccpd, and Vccq are approximately equal to a ground voltage), the output 65 of inverter 67 is still low even though the output 63 of OR gate 62 is also low (e.g., because OR gate 62 and inverter 65 are both unpowered in this example). Circuit 52 therefore produces an output at the appropriate level, even when power supply circuit 64 is not producing a valid power supply.

The inverted power-on-reset signal (NPOR) generated on output 67 of FIG. 4 and the inverted hotsocket signal (N GLOBAL HOTSOCKET) generated on output 51 of FIG. 3 may be routed to local hotsocket circuitry in some or all of the input-output blocks of device 10. In general, device 10 may include any desired number of input-output (I/O) blocks. As examples, device 10 may include 100 or fewer input-output blocks, between 100 and 2000 input-output blocks, approximately 1000 input-output blocks, or may include 2000 or more input-output blocks. With one suitable arrangement, each input-output block in device 10 may be associated with a respective one of the external pins 14 of FIG. 1. In general, each input-output block can be used to drive data off device 10 into external device and can be used to receive data driven into device 10 by external devices.

Figure 5:
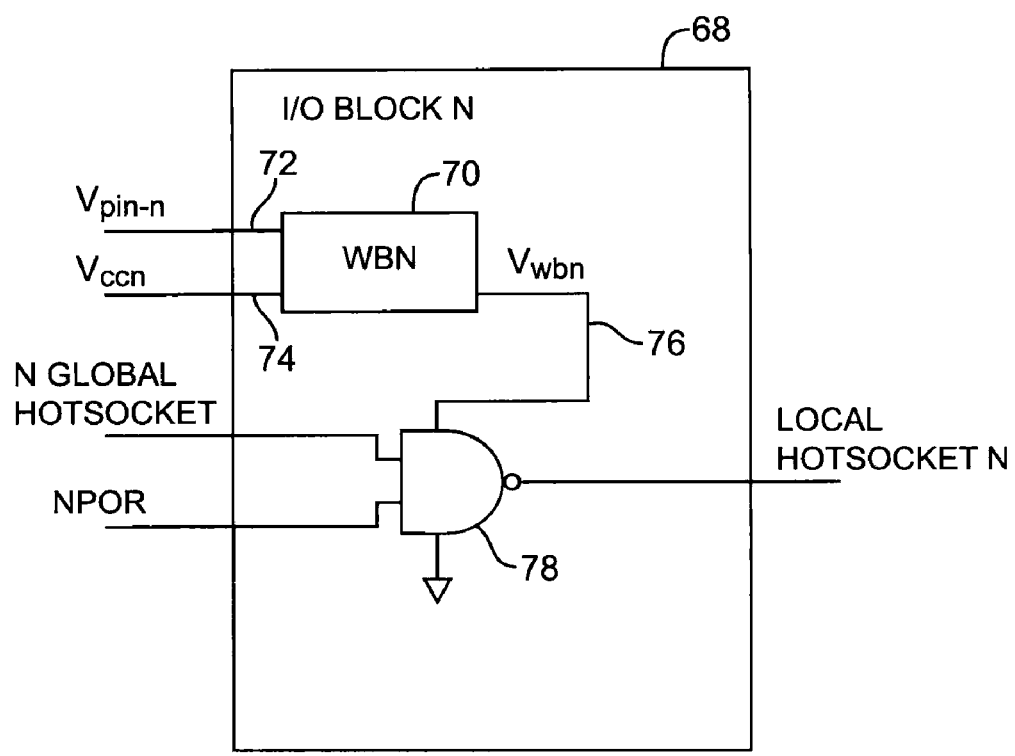
FIG. 5 is a circuit diagram of an illustrative local hotsocket circuit that may be used to generate a local hotsocket signal in accordance with an embodiment of the present invention.

With one suitable arrangement, each of the input-output blocks in device 10 may include a local hotsocket circuit 68 as shown in the example of FIG. 5. FIG. 5 illustrates an "nth" one of the input-output blocks in device 10.

Each of local hotsocket circuit 68 may include a power supply circuit (WBN) 70. The power supply circuit 70 has a first input 72 that receives voltage Vpin-n (e.g., a data or power signal from a pin 14 associated with the "nth" input-output block) and a second input 74 that receives voltage Vccn. Power supply circuit 70 produces a power supply voltage Vwbn on output 76 that is equal to the larger of Vccn and Vpin-n. The output signal Vwbn is received by NAND gate (e.g., received by a power supply terminal in NAND gate 78). Power supply circuit 70 may sometimes be referred to herein as an output circuit, a well bias circuit, a local well bias circuit, and an "nth" local well bias circuit. If desired, logic gate 78 may be implemented with other types of logic (e.g., using an AND gate, an OR gate, or a NOR gate). The use of a NAND gate implementation for logic gate 78 is merely illustrative.

The NAND gate 78 in the local hotsocket circuit 68 of each input-output block has signal inputs that receive the inverted global hotsocket signal (N GLOBAL HOTSOCKET) generated by circuitry 26 of FIG. 3 and the inverted power-on-reset signal (NPOR) generated by circuitry 52 of FIG. 4. When at least one of the inputs to the NAND gate 78 is at a logic zero, the output of the NAND gate 78 is at a logic one (e.g., the voltage provided by power supply circuit 70). When both inputs to the NAND gate 78 are at a logic one, the output of the NAND gate 78 is at a logic zero.

The output of the NAND gate 78 may be a local hotsocket signal (LOCAL HOTSOCKET N) and may be used in disabling input-output circuits in the "nth" input-output block during hotsocket conditions. For example, the output of the NAND gate 78 may be used to selectively control a transistor such as transistor 82 of FIG. 6A.

Figure 6A:
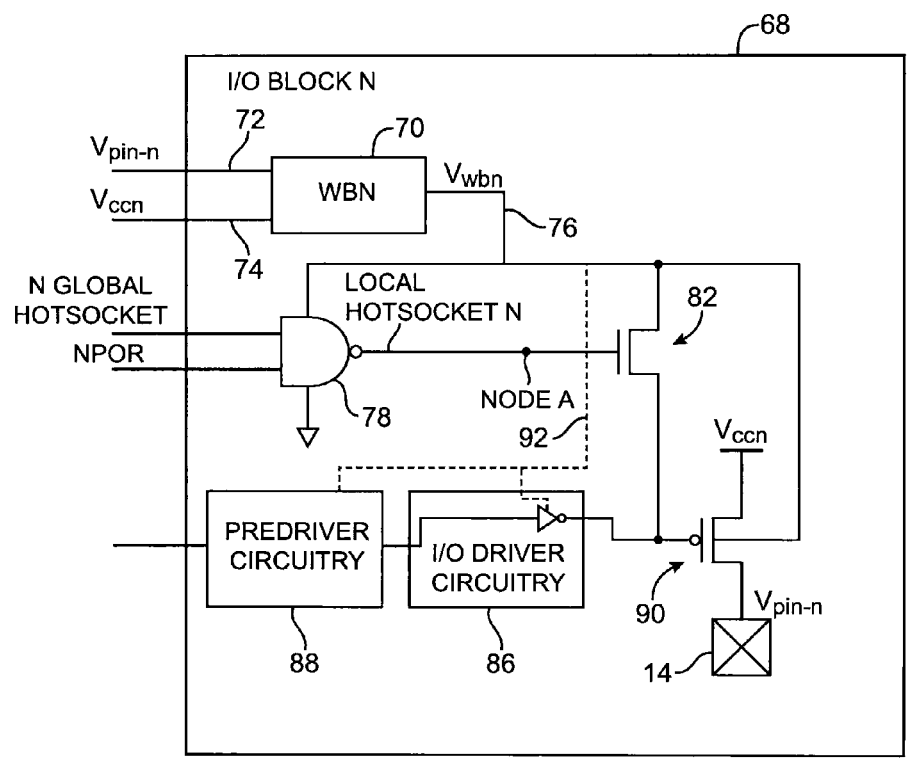
FIGS. 6A and 6B are circuit diagrams of illustrative input-output circuitry that may include an output buffer and local hotsocket circuit that generates a local hotsocket signal to disable the output buffer when hotsocket conditions are detected in accordance with an embodiment of the present invention.

As shown in FIG. 6A, circuitry 68 may include transistor 82. Like the NAND gate 78, transistor 82 may be powered by the output of the power supply circuit 70 (e.g., transistor 82 may have power supply terminals connected to the output 76 of circuit 70). With one suitable arrangement, the output of NAND gate 78 may be routed to NODE A and the gate of transistor 82. With this arrangement, transistor 82 is controlled by the local hotsocket signal (LOCAL HOTSOCKET N) for the input-output block of FIG. 6A (e.g., for the "nth" input-output block). Transistor 82 may sometimes be referred to as a hotsocket protection transistor.

Transistors such as transistor 82 may be used to protect driver circuitry in each input-output block from damage during hotsocket conditions. For example, transistor 82 may selectively isolate or couple together the output of the power supply circuit 70 and data line 80 depending on the output of the NAND gate 78. When the output of the NAND gate 78 is low, transistor 82 is turned off and I/O driver circuitry 86 and predriver circuitry 88 can drive data onto pin 14 using buffer transistor 90. As shown by dotted line 92, I/O driver circuitry 86 and predriver circuitry 88 may optionally be powered by the output of power supply circuit 70. Buffer transistor 90 may be coupled between a positive power supply line (e.g., a line that carries the power supply voltage Vccn) and the pin 14, as one example. If desired, a body terminal of buffer transistor 90 may also be connected to the output of the power supply circuit 70.

During hotsocket conditions when the output of the NAND gate 78 is high, transistor 82 is turned on. When transistor 82 is turned on (i.e., during hotsocket conditions), the gate of buffer transistor 90 is coupled to the output of the power supply circuit 70. By connecting the output of circuit 70 to the gate and body terminal of buffer transistor 90, buffer transistor 90 can be turned off regardless of the order in which power supply and data pins are connected, thereby protecting circuitry 68 and circuits 86 and 88 from damage during hotsocket condition. As shown in FIG. 6A, the gate of transistor 90 may be coupled to the output of NAND gate 78 through transistor 82.

With the arrangement of FIG. 6A, each local hotsocket circuit 68 can actively protect input-output circuitry in its associated input-output block during hotsocket conditions. For example, when a voltage is received on one of the data pins 14 associated with a particular input-output block, the local hotsocket circuit 68 associated with that data pin can generate a positive power supply signal using circuit 70 to actively protect the input-output circuitry in that input-output block, regardless of whether or not any of the power supply voltages (Vcc, Vccn, and Vccpd) in device 10 are available. For example, when power supply voltages Vcc, Vccn, and Vccpd are all unavailable and a signal Vpin-n is received on pin 14 in the "nth" input-output block, power supply circuit 70 will produce a voltage Vwbn approximately equal to the signal Vpin-n. Because the power supply voltages Vcc, Vccn, and Vccpd are all unavailable, the inputs to NAND gate 78 are at a logic low level and the output of NAND gate 78 is at a logic high level (e.g., Vwbn) that is sufficient to turn on transistor 82.

Figure 6B:
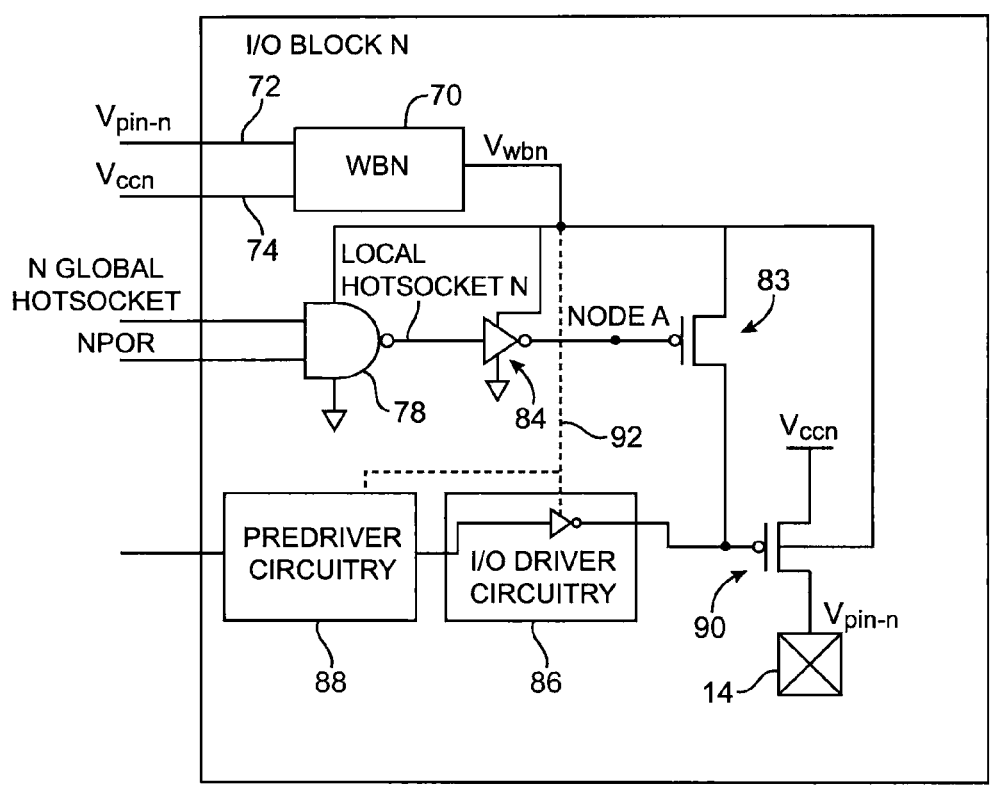

As shown in FIG. 6B, the n-channel transistor 82 of FIG. 6A may be replaced with a p-channel transistor 83, if desired. With one suitable arrangement, an inverter 84 powered by circuit 70 may be placed between the output of NAND gate 78 and the gate terminal of transistor 83 (e.g., so that transistor 83 receives the appropriate control signals). With another suitable arrangement, NAND gate 78 may be replaced with an AND gate (e.g., rather than adding the inverter 84).

As shown in FIGS. 5, 6A, and 6B), the hotsocket logic in input-output block 68 (e.g., NAND gate 78) exclusively uses the inverted global hotsocket signal and the inverter power-on-reset signal in disabling input-output circuitry during hotsocket conditions.

The operation of global hotsocket circuitry 26 (FIG. 3), power-on-reset and hotsocket circuitry 52 (FIG. 4), and a local hotsocket circuit 68 (FIG. 6A) associated with an nth input-output block in device 10 is shown in a table in FIG. 7. The levels of power supply voltages Vccq, Vccpd, and Vccn are shown in the first, second, and third columns of the table, respectively. The voltages Vccq, Vccpd, and Vccn are said to be "ready" when they are fully powered or are at least above a threshold level and are said to be "not ready" when they are at a low voltage (e.g., when ramping up) and are not fully powered.

The fourth and fifth columns of the table in FIG. 7 show the digital values of the signal (GLOBAL HOTSOCKET) from output 50 of OR gate 42 (FIG. 3) and the power-on-reset signal (POR) from output 63 of OR gate 62 (FIG. 4). The sixth column of the table indicates whether the voltage received on an nth data pin 14 associated with the "nth" input-output block is less than or greater than the power supply voltage Vccn. The seventh column of the table shows the digital value of the signal at node A (e.g., the signal controlling transistor 82 of FIG. 6A).

Each row in the table of FIG. 7 relates to a different potential scenario.

For example, consider the situation in which each of the power supply voltages Vccq, Vccpd, and Vccn is fully powered. In this situation, the output 51 of inverter 53 and the output 67 of inverter 65 are pulled high (e.g., the N GLOBAL HOTSOCKET and the NPOR signals are high). Node A is also pulled low, thereby turning off transistor 82 and allowing input-output driver circuitry 86 to drive data onto pin 14 using buffer transistor 90.

The third, fourth, fifth, sixth, seventh, and eighth rows of the table of FIG. 7 are associated with situations in which at least one of the power supply voltages Vccq, Vccpd, and Vccn is not ready. In these situations, the output 51 of inverter 53 and the output 67 of inverter 65 are pulled low (e.g., the N GLOBAL HOTSOCKET and the NPOR signals are low). Node A is also pulled high. The voltage on Node A is equal to the larger of the voltage Vpin-n (e.g., the voltage on pin 14 for the nth input-output block) and the power supply voltage Vccn (if present).

The last row of the table of FIG. 7 is associated with the situation in which Vccc, Vccpd, and Vccn are all not ready. Because none of the power supply voltages are ready, the system is not powered and the N GLOBAL HOTSOCKET and NPOR signals are low (e.g., because inverters 53 and 65 are not powered). As shown in the last row of the table, if a voltage is present on the pin 14 for the "nth" input-output block, Node A is still pulled up to the voltage Vpin-n, thereby protecting input-output circuitry in that "nth" input-output block from damage.

Figure 8:
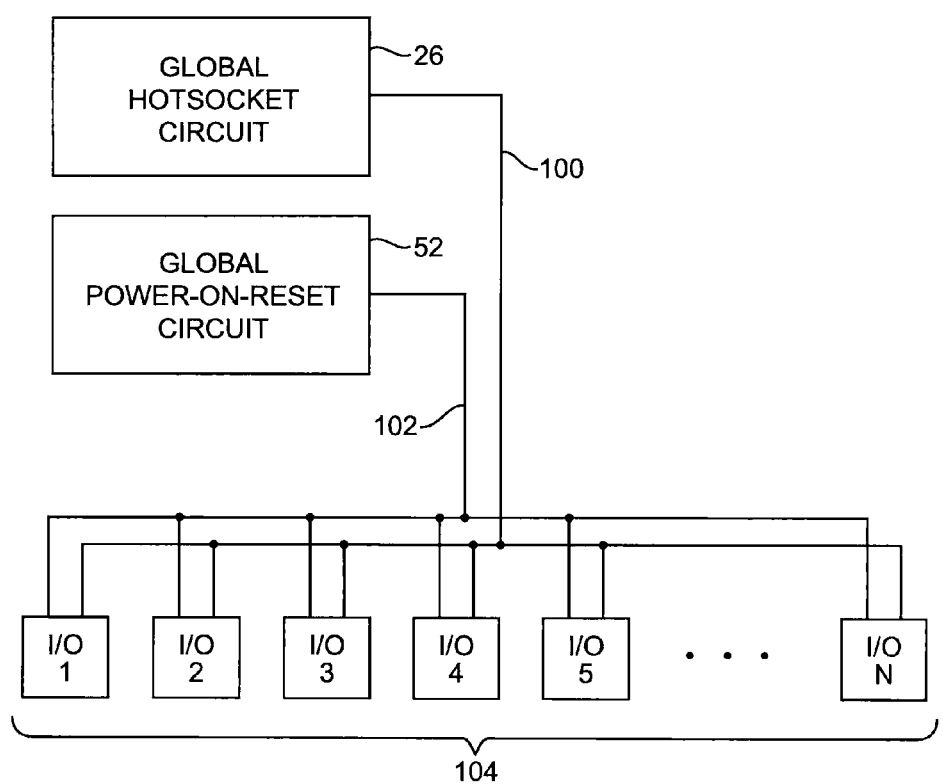
FIG. 8 is a schematic diagram showing how signals generated by a global hotsocket circuit and a global power-onreset circuit may be routed to a plurality of input-output blocks on an integrated circuit such as a programmable logic device integrated circuit in accordance with an embodiment of the present invention.

As shown in FIG. 8, global hotsocket signals and global power-on-reset signals may be distributed from a global hotsocket circuit 26 and a global power-on-reset circuit 52 to a plurality of input-output blocks 104 on device 10. For example, global hotsocket circuit 26 may distribute an inverted global hotsocket signal such as the signal (N GLOBAL HOTSOCKET) of FIG. 3 to the input-output blocks 104 over path 100. Global power-on-reset circuit 52 may distribute an inverted power-on-reset signal such as the signal (NPOR) of FIG. 4 to the input-output blocks 104 over path 102. If desired, each of the input-output blocks 104 may exclusively use the signals received on paths 100 and 102 in controlling hotsocket protection circuitry.

The foregoing is merely illustrative of the principles of this invention and various modifications can be made by those skilled in the art without departing from the scope and spirit of the invention.

What is claimed is:

1. An integrated circuit comprising:
   a global hotsocket detector operable to generate a global hotsocket signal based on power supply signals;
   a power-on-reset circuit operable to generate a power-on-reset signal;
   a plurality of external pins;
   a plurality of logic gates, each of which is associated with a respective one of the external pins, wherein each of the logic gates has a first input operable to receive the global hotsocket signal over a global hotsocket signal path and has a second input operable to receive the power-on-reset signal over a global power-on-reset signal path; and
   a plurality of buffer transistors, wherein each of the buffer transistors is associated with a respective one of the external pins, has a gate terminal coupled to an output of the logic gate associated with that external pin, and has a source-drain terminal coupled to that external pin.

2. The integrated circuit defined in claim 1 wherein the logic gates comprise gates selected from the group consisting of: NAND gates, AND gates, NOR gates, and OR gates.

3. The integrated circuit defined in claim 1 further comprising a plurality of hotsocket transistors, wherein each of the hotsocket transistors is associated with a respective one of the external pins and is coupled between the logic gate and the buffer transistor associated with that external pin.

4. An integrated circuit comprising:
   a global hotsocket detector operable to generate a global hotsocket signal based on power supply signals;
   a power-on-reset circuit operable to generate a power-on-reset signal;
   a plurality of external pins;
   a plurality of logic gates, each of which is associated with a respective one of the external pins, wherein each of the logic gates has a first input operable to receive the global hotsocket signal over a global hotsocket signal path and has a second input operable to receive the power-on-reset signal over a global power-on-reset signal path; and
   a plurality of well bias circuits, wherein each of the well bias circuits is associated with a respective one of the external pins, has a first input coupled to that external pin, has a second input coupled to a global positive power supply line, and has an output coupled to a positive power supply terminal of the logic gate associated with that external pin.

5. The integrated circuit defined in claim 4 further comprising a plurality of inverters, each of which is associated with a respective one of the external pins, has an input coupled to an output of the logic gate associated with that external pin, and has a positive power supply terminal coupled to the output of the well bias circuit associated with that external pin.

6. Circuitry comprising:
   an integrated circuit input-output pin;
   a logic gate that has first and second inputs and an output, wherein the first input is operable to receive a global hotsocket signal and wherein the second input is operable to receive a power-on-reset-signal;
   a transistor that has a gate terminal coupled to the output of the logic gate and that has a source-drain terminal coupled to the integrated circuit input-output pin; and
   a hotsocket transistor coupled between the logic gate and the transistor.

7. The circuitry defined in claim 6 further comprising a global hotsocket detector operable to generate the global hotsocket signal based on power supply signals.

8. The circuitry defined in claim 6 further comprising a power-on-reset circuit operable to generate the power-on-reset signal.

9. The circuitry defined in claim 6 wherein the hotsocket transistor has a gate terminal coupled to the output of the logic gate and a first source-drain terminal coupled to the gate terminal of the transistor.

10. The circuitry defined in claim 9 further comprising a well bias circuit that has an input coupled to the integrated circuit input-output pin and that has an output coupled to a positive power supply terminal of the logic gate, wherein the hotsocket transistor has a second source-drain terminal that is coupled to the output of the well bias circuit.

11. The circuitry defined in claim 6 further comprising a well bias circuit that has a first input coupled to the integrated circuit input-output pin, that has a second input coupled to a positive power supply line, and that has an output coupled to a positive power supply terminal of the logic gate.

12. The circuitry defined in claim 11 wherein the logic gate comprises a gate selected from the group consisting of: an AND gate, a NAND gate, an OR gate, and a NOR gate, and wherein the hotsocket transistor comprises an re-channel metal-oxide-semiconductor transistor.

13. The circuitry defined in claim 10 further comprising an inverter that has an input coupled to the output of the logic gate, that has an output coupled to the gate terminal of the hotsocket transistor, and that has a positive power supply terminal coupled to the output of the well bias circuit.

14. The circuitry defined in claim 13 wherein the hotsocket transistor comprises a p-channel metal-oxide-semiconductor transistor.

15. The circuitry defined in claim 11 wherein the transistor has a body bias terminal coupled to the output of the well bias circuit.

16. An integrated circuit, comprising:
   a global hotsocket detector operable to generate a global hotsocket signal based on first, second, and third positive power supply signals, wherein the first positive power supply signal is greater than the second positive power supply signal and wherein the second positive power supply signal is greater than the third positive power supply signal;
   a power-on-reset circuit operable to generate a power-on-reset signal;
   a plurality of integrated circuit input-output pins; and
   a plurality of circuits, each of which is associated with a respective one of the integrated circuit input-output pins, wherein each of the circuits has a first input operable to receive the global hotsocket signal over a global hotsocket signal path and has a second input operable to receive the power-on-reset signal over a global power-on-reset signal path.

17. The integrated circuit defined in claim 16 wherein the plurality of circuits comprises a plurality of input-output circuit blocks.

18. The integrated circuit defined in claim 17 wherein each of the input-output circuit blocks has a logic gate having a first input coupled to the global hotsocket signal path and a second input coupled to the global power-on-reset signal path.

* * * * *